United States Patent [19]

Yamazaki

[11] Patent Number: 5,345,039
[45] Date of Patent: Sep. 6, 1994

[54] FILM CARRIER

[75] Inventor: Hideo Yamazaki, Kisarazu, Japan

[73] Assignee: Minnesota Mining and Manufacturing Company, St. Paul, Minn.

[21] Appl. No.: 926,348

[22] Filed: Aug. 6, 1992

[51] Int. Cl.$^5$ ............................................ H01L 23/02
[52] U.S. Cl. .................................... 174/52.4; 257/668
[58] Field of Search ............................ 174/52.2, 52.4; 257/678, 687, 690, 694, 701, 668

[56] References Cited

U.S. PATENT DOCUMENTS

| 5,064,706 | 11/1991 | Ueda et al. | 174/52.4 |
| 5,087,961 | 2/1992 | Long et al. | 174/52.4 |
| 5,134,247 | 7/1992 | Wehner et al. | 257/668 |

OTHER PUBLICATIONS

Connection Technology, Mar. 1988 Electronic Packaging & Production, Feb. 1990.

Primary Examiner—Leo P. Picard
Assistant Examiner—Bot Ledynh
Attorney, Agent, or Firm—Gary L. Griswold; Walter N. Kirn; John C. Barnes

[57] ABSTRACT

The present invention relates to a film carrier for semiconductor devices, the film carrier comprising a dielectric film 1 having at least one opening 9 formed therein, and a support ring 2 disposed in the opening and made of a material the same as that of the dielectric film, the support ring 2 being thinner than other portions, without deteriorating the entire mechanical strength of the film carrier, the electric characteristics at the support ring can differ from the electrical characteristic at the other portions of the film carrier.

6 Claims, 3 Drawing Sheets

FILM CARRIER

BACKGROUND OF THE INVENTION

The present invention relates to a film carrier applicable to a carrier tape which is used to manufacture, for example, IC cards and, more particularly, relates to a film carrier suitable for semiconductor devices.

DESCRIPTION OF THE PRIOR ART

In order to fabricate extremely thin electric products such as IC cards, a variety of semiconductor devices or substrates are used therein and they should preferably be as thin as possible. From such a point of view, TSOP (Thin small outline package) or the like has already been put to practical use. A carrier tape made of dielectric film has also attracted considerable attention from such thinning point of view.

For the conventional carrier tapes for semiconductor devices, dielectric films of about 0.025 to 0.125 mm thickness were mainly used, the thickness of each of such dielectric films being uniform over the entire area of the tape. A carrier tape is usually placed on a bonding machine when semiconductor devices are mounted, and sprocket holes in the carrier tape are used to carry out a "tape feeding" and "positioning for mounting", so that a certain degree of strength is required for the sprocket holes at side edges of the carrier tape. Therefore, the thickness of the dielectric film constituting the carrier tape was required to be more than 0.025 mm.

Some conventional film carriers had a micro-strip structure having a section shown in FIG. 6. That is, a micro-strip line 14 is secured to one surface of a dielectric film 15, whereas a metallic ground layer 16 is secured to the other surface of the dielectric film 15. The ground layer 16 is provided in order to control the characteristic impedance of the micro-strip line 14 to a desired value.

In the micro-strip structure shown in FIG. 6, the characteristic impedance of the micro-strip line is determined by the width (W), the height (T) and the location of the micro strip line 14, and the thickness (H) and the dielectric constant of the dielectric film 15.

When the thickness of dielectric film to be used for the film carrier is made to be less than 0.025 mm as described above, the mechanical strength is deteriorated and the handling of the film carrier by the bonding machine may be hindered.

In addition, as the conventional film carrier had a uniform thickness, it was impossible to change the thickness (T) of the dielectric film 15 and the dielectric constant in the conventional micro-strip structure shown in FIG. 6. For this reason, the configuration and location of the micro-strip line 14 were altered so as to control the characteristic impedance to a desired value. This method, however, has following disadvantages:

(a) Designs of the micro-strip lines are greatly limited;
(b) Due to the limitation in the designs of the microstrip lines, the characteristic impedance can not be controlled over a wide range.
(c) The characteristic impedances are simply determined to be the identical values if the configurations and locations of the micro-strip lines are the same, and it is impossible to control the characteristic impedances partially.

SUMMARY OF THE PRESENT INVENTION

The film carrier according to the present invention comprises a dielectric film having at least one opening formed therein, and a support ring made of a material the same as that of the dielectric film and separated from the inner periphery of the opening, the support ring being thinner than other film portions.

In the film carrier of the present invention, the dielectric film is thinner in only one area so as not to deteriorate the entire mechanical strength of the film carrier. In addition, one area of the dielectric film has a desired thickness in order to provide the area with an electric characteristic differing from those in the other areas.

DESCRIPTION OF THE DRAWING

The embodiments of the present embodiment will then be described with reference to the accompanying drawings, wherein.

DESCRIPTION OF THE PRESENTLY PREFERRED EMBODIMENTS

Figure 1:
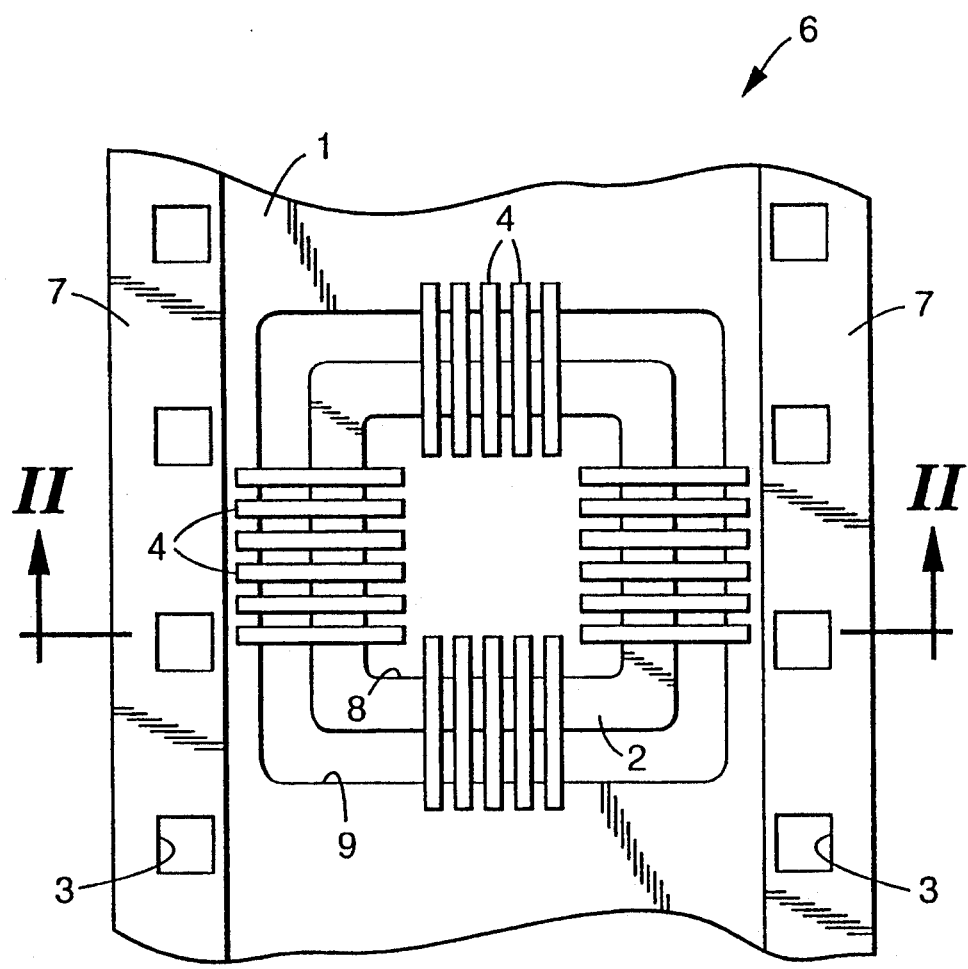
FIG. 1 is a plan view of the first embodiment according to the present invention.
Figure 2:
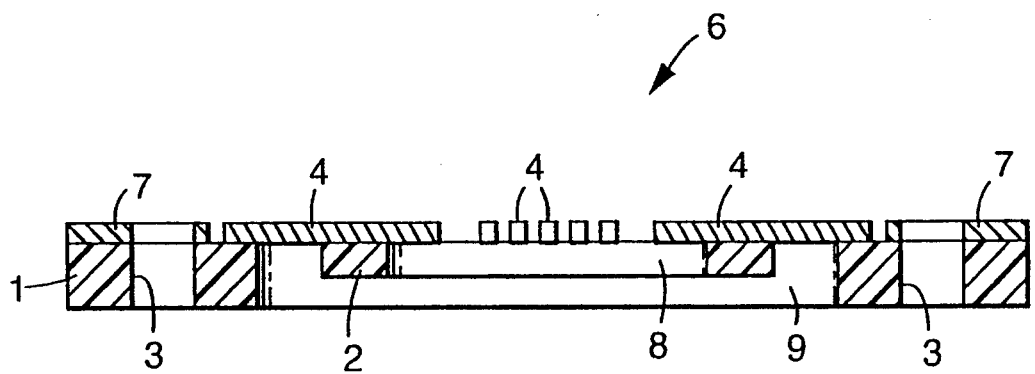
FIG. 2 is a sectional view taken along the line II—II of FIG. 1.

A carrier tape 6 made of a film carrier shown in FIG. 1 includes an elongated dielectric film 1, reinforcement layers 7 secured to the upper surface of the dielectric film 1 at both side edges of the dielectric film 1, and rows of sprocket holes 3 which are formed in the reinforcement layer 7 and the dielectric film 1 along both side edges of the carrier tape 6. The dielectric film 1 has formed therein a substantially square opening 9 disposed at the center of its widthwise direction. In this opening 9 there is disposed a square support ring 2 which defines a square opening 8 for the semiconductor device at the center thereof. This support ring 2 is formed of a dielectric film of the same material as that of the dielectric film 1. As shown in FIG. 2, the thickness of the support ring 2 is thinner than the thickness of the dielectric film 1. A plurality of metallic lead wires 4 are disposed between the upper surface of the support ring 2 and the upper surface of the dielectric film 1, the inner ends of the metallic wires extending into the opening 8.

In the first embodiment, the dielectric film of the support ring 2 of the carrier tape is thinner than the other dielectric film 1, as described above. The reinforcement layer 7 made of copper foil is secured to the dielectric film 1 around the sprocket holes 3 so as to provide a sufficient mechanical strength for the handling of the tape during bonding process.

Figure 3:
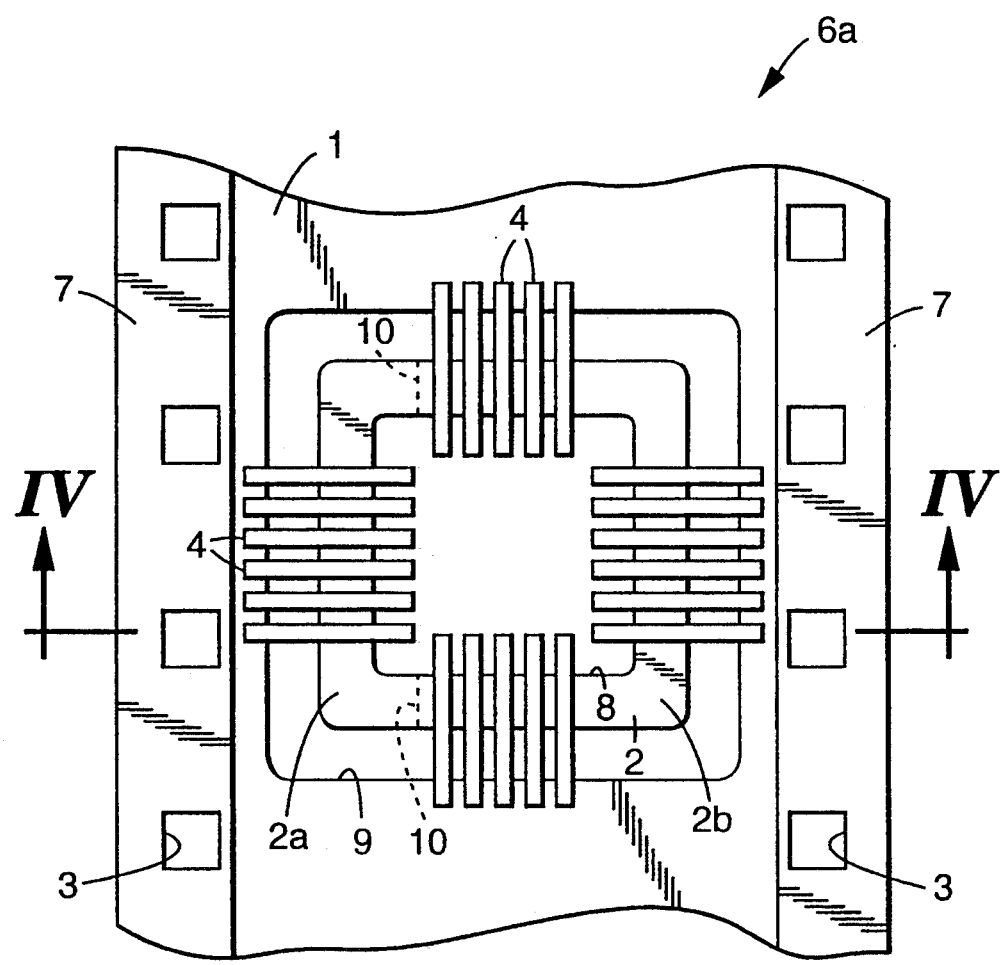
FIG. 3 is a plan view of the second embodiment according to the present invention.
Figure 4:
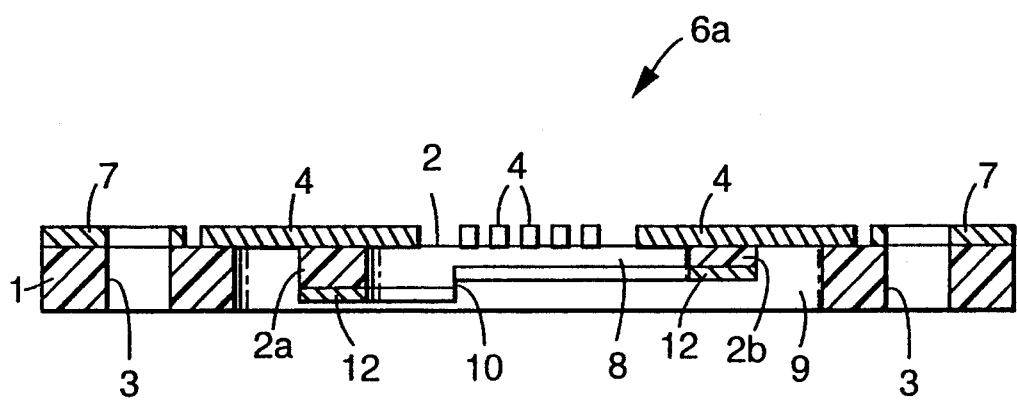
FIG. 4 is a sectional view taken along the line IV—IV of FIG. 3.

FIG. 3 is a plan view of the second embodiment according to the present invention. FIG. 4 is a sectional view taken along the line IV—IV of FIG. 3. In FIGS. 3 and 4, the reference numerals are the same as those used in FIGS. 1 and 2 to show the members identical or equivalent to those in FIGS. 1 and 2.

In a carrier tape 6a of the second embodiment, the thickness of the dielectric film forming a support ring 2 is thinner than the thickness of the dielectric film 1 and, in addition, the thickness of a portion 2b on the right side of the support ring 2 as viewed in FIG. 3 is thinner than that of a portion 2a on the left side. Moreover, a ground layer 12 is secured to the surface (under surface) opposite to the surface on which metallic lead wires 4 of the support ring 2 are disposed. A broken line 10 in FIG. 3 shows the interface between the portion 2a on the left side with relatively large thickness and the portion 2b of the right side with relatively small thickness.

In the second embodiment, as described above, the thickness of the support ring 2 is thinner than the thickness of the dielectric film 1, and the metallic ground layer 12 is secured to the under surface of the support ring 2. Moreover, the thickness of the portion 2b of the support ring 2 on the right side as viewed in FIG. 3 is thinner than that of the portion 2a on the left side so as to differentiate the electrical characteristics of both portions.

Although not shown in the drawings, the scope of the present invention embraces a film carrier having metallic patterns on both faces of the dielectric film having a portion thinner than other portions.

The dielectric film may be made of any material capable of etching chemically or by laser processing. An example of such material is polyamide.

The method of production of the film carrier according to the present invention will hereinafter be described. FIG. 5(a) to FIG. 5(d) are sectional views illustrating one example of the method of production of the film carrier according to the present invention.

Figure 5A:
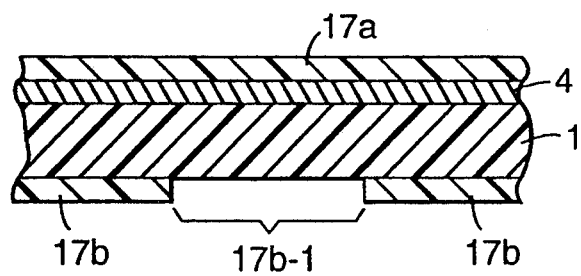
FIGS. 5(a), 5(b), 5(c), and 5(d) are sectional views illustrating one example of the method of production of the film carrier according to the present invention.

Referring first to FIG. 5(a), to both faces of a film carrier comprising dielectric film 1 on which a metallic lead wire is attached, there are applied photosensitive films 17a and 17b which are stable against the chemical liquid for dissolving the dielectric film 1. Next, a part of the photosensitive film 17b is removed by means of photolithography to form a window 17b-1. FIG. 5(a) shows this condition.

A portion 1-a of the dielectric film exposed to the window 17b-1 is dissolved by chemical etching to reduce the thickness of the portion. Then, photosensitive films 17a and 17b are removed.

Figure 5B:
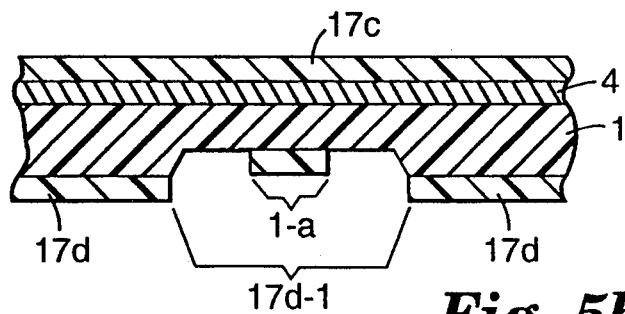

Thereafter, photosensitive films 17c and 17d are again applied to both surfaces of the dielectric film 1 and, then, a part of the photosensitive film 17d is removed by photolithography to form a window 17d-1 (refer to FIG. 5(b).

Figure 5C:
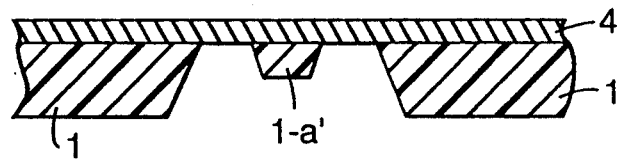

A part of a portion 1-a of the dielectric film 1 which is exposed to the window 17d-1 is dissolved and removed by etching, all the photosensitive films 17c and 17d are removed (refer to FIG. 5(c)). Due to this etching, only a part 1-a' of the portion 1-a is left. This part 1-a' corresponds to the support ring 2 shown in FIG. 1.

Figure 5D:
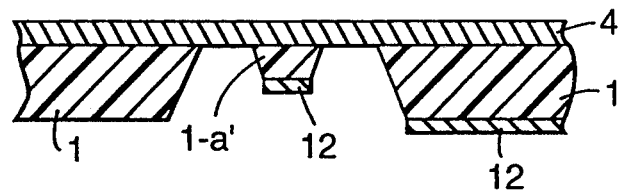
Figure 6:
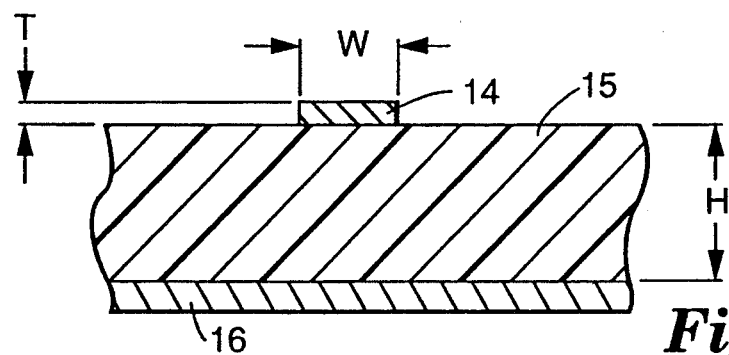
FIG. 6 is a sectional view of a prior art carrier tape.

In case where the above-mentioned ground layer 12 described with reference to FIG. 3 has to be attached, the ground layer 12 is secured to the undersurface of the dielectric film 1 as shown in FIG. 5(d). Such attachment of the ground layer can easily be carried out by means of electroless plating or vacuum evaporation technique.

As described above, according to the present invention, a desired portion of the film carrier can be thinned without deteriorating the mechanical strength of the film carrier.

In the film carrier having a ground layer moreover, even though the control of the characteristic impedance by the design of the micro-strip line is difficult, the impedance characteristics can be controlled by varying the thickness of the dielectric film, thereby enhancing freedom for designs of the micro-strip line. In addition, since the thickness of the dielectric film can be controlled within a fairly wide range, the thickness control in combination with designs of the micro-strip line still widens the control of the characteristics impedance. Even in the areas where micro-strip lines are arranged in the same manner, the characteristic impedances with different values can be obtained by varying the thickness of the dielectric film in those areas.

I claim:

1. A film carrier comprising a dielectric film having opposite surfaces spaced a given thickness and having at least one opening formed therein, a support ring made of a dielectric film material and arranged inside of said opening and spaced from the inner periphery of said opening, said support ring having opposite surfaces spaced a given thickness less than said thickness between said surfaces of said dielectric film, and metallic lead wires on one surface of said dielectric film and support ring joining the support ring and the dielectric film, wherein a metallic ground layer is secured to the surface of said support ring opposite to the surface on which said metallic lead wires are placed.

2. A film carrier comprising a dielectric film having opposite surfaces spaced a given thickness and having at least one opening formed therein, a support ring made of a dielectric film material and arranged inside of said opening and spaced from the inner periphery of said opening, said support ring having opposite surfaces spaced a given thickness less than said thickness between said surfaces of said dielectric film, and metallic lead wires on one surface of said dielectric film and support ring joining the support ring and the dielectric film, wherein said support ring includes at least two areas having different thicknesses each area having a thickness less that said dielectric film.

3. A film carrier according to claim 2 wherein said dielectric film is of an elongated shape and has sprocket holes arranged in line along both side edges thereof.

4. A film carrier according to claim 3 wherein said elongated film includes a reinforcement layer provided along its said side edges.

5. A film carrier comprising a dielectric film having opposite surfaces spaced a given thickness and having at least one opening formed therein, a support ring made of a dielectric film material and arranged inside of said opening and spaced from the inner periphery of said opening, said support ring having opposite surfaces spaced a given thickness less than said thickness between said surfaces of said dielectric film, and metallic lead wires on one surface of said dielectric film and support ring joining the support ring and the dielectric film, wherein said dielectric film is of an elongated shape and has formed therein sprocket holes arranged along opposite side edges thereof.

6. A film carrier according to claim 5 wherein said dielectric film includes reinforcement layers provided along said side edges.

* * * * *